United States Patent [19]

Palathingal

[11] Patent Number: 5,475,228

[45] Date of Patent: Dec. 12, 1995

[54] UNIPOLAR BLOCKING METHOD AND APPARATUS FOR MONITORING ELECTRICALLY CHARGED PARTICLES

[75] Inventor: Jose C. Palathingal, Mayaguez, Puerto Rico

[73] Assignee: University of Puerto Rico, San Juan, Puerto Rico

[21] Appl. No.: 345,079

[22] Filed: Nov. 28, 1994

[51] Int. Cl.[6] ................................................ H01J 47/18
[52] U.S. Cl. ................................. 250/397; 324/71.3
[58] Field of Search ............................ 250/397, 310; 324/71.3, 250, 179

[56] References Cited

U.S. PATENT DOCUMENTS

| | | | |
|---|---|---|---|
| 3,170,116 | 2/1965 | Farrington | 250/397 |
| 3,450,879 | 6/1969 | Seppi | 250/83.3 |
| 3,492,480 | 1/1970 | Vogel | 250/83.3 |
| 3,513,313 | 5/1970 | Schwartz | 250/83.3 |
| 3,541,331 | 11/1970 | Hunt, Jr. et al. | 250/83 |
| 3,567,925 | 3/1971 | Muga et al. | 250/71.5 |
| 3,612,858 | 10/1971 | De Parry | 324/71.3 |
| 3,626,184 | 12/1971 | Crewe | 250/49.5 A |
| 3,857,090 | 12/1974 | Chick | 324/47 |
| 3,906,230 | 9/1975 | Hagen | 250/336 |
| 4,442,355 | 4/1984 | Tamura et al. | 250/310 |
| 4,658,136 | 4/1987 | Ohtaka et al. | 250/310 |
| 4,687,936 | 8/1987 | McIntyre et al. | 250/397 |
| 4,758,722 | 7/1988 | Leckey et al. | 250/305 |
| 4,831,267 | 5/1989 | Brunner | 250/397 |
| 4,868,394 | 9/1989 | Fukuhara et al. | 250/397 |
| 4,877,961 | 10/1989 | McIntyre et al. | 250/397 |
| 5,223,711 | 6/1993 | Sanderson et al. | 250/281 |

*Primary Examiner*—Jack I. Berman
*Assistant Examiner*—Kiet T. Nguyen
*Attorney, Agent, or Firm*—Bell, Seltzer, Park & Gibson

[57] ABSTRACT

An apparatus for monitoring an electrically charged particle pulse includes at least one coil defining an opening therethrough. The coil generates a bipolar signal responsive to the electrically charged particle pulse passing through the opening, and the bipolar signal comprises a first portion having a first polarity and a second portion having a second polarity. Unipolar blocking diode connected to the coil passes the first portion of the bipolar signal having a first polarity and blocks the second portion of the bipolar signal having the second polarity. Monitoring Device connected to the unipolar blocking diode generates an output signal representative of a predetermined characteristic of the particle based upon the first portion of the bipolar signal which is passed by the unipolar blocking diode. In a preferred embodiment, the coil has a toroidal shape and comprises a plurality of windings electrically connected in parallel, and each of these windings comprises a plurality of conductive loops. The apparatus may also comprise a series of coils arranged so as to define a predetermined path for passage of the electrically charged particle through each respective opening of each respective coil.

25 Claims, 9 Drawing Sheets

FIG. 12
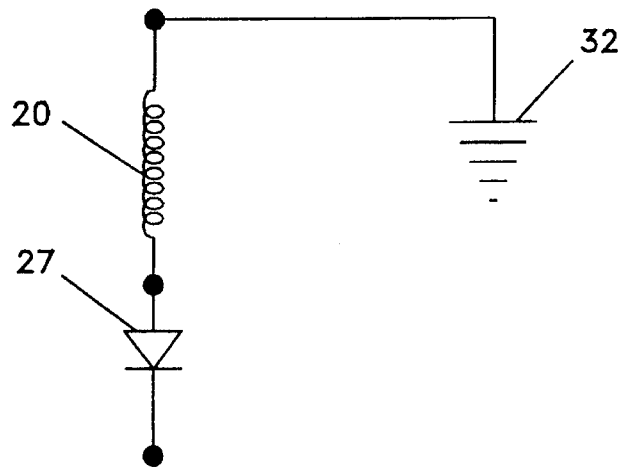
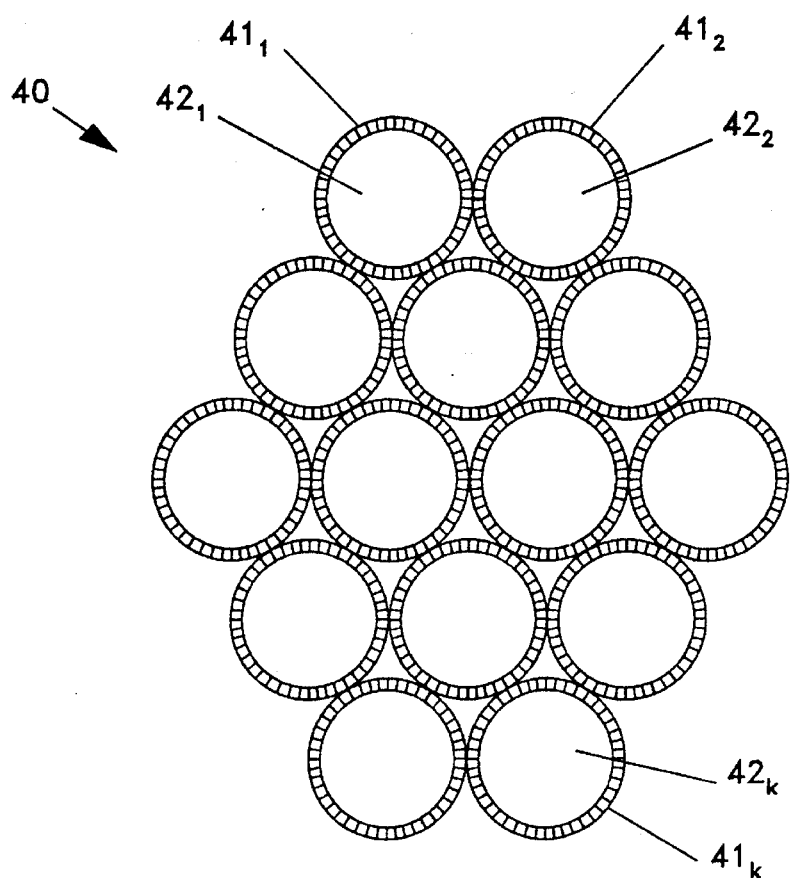
FIG. 15

UNIPOLAR BLOCKING METHOD AND APPARATUS FOR MONITORING ELECTRICALLY CHARGED PARTICLES

FIELD OF THE INVENTION

The present invention relates to the monitoring of electrically charged particles, and more particularly to the monitoring of charged particles without significantly altering the energy, direction, velocity, charge, or state of the particles.

BACKGROUND OF THE INVENTION

The monitoring of electrically charged particles is required in many technologies. In devices as varied as mass spectrometers, ion implanters, and scanning electron microscopes, electrically charged particles are projected along a path and then used to achieve a desired result. In particle colliders, such as the Relativistic Heavy Ion Collider at Brookhaven National Laboratory in Long Island, New York, electrically charged particles are projected along a path for the purpose of studying the characteristics of the particles. Accordingly, there is a need to monitor electrically charged particles as they travel along a path without significantly altering the energy, direction, velocity, charge, or state of the electrically charged particles.

An example of a particle detector is disclosed in U.S. Pat. No. 3,450,879 to Seppi et al. entitled "Dielectric-Type Charged Particle Detector". In this patent, the detector includes a thin dielectric in contact with a pair of electrodes wherein a voltage is applied to the dielectric through the electrodes resulting in a current that is proportional to the intensity of irradiation impinging on the dielectric. In U.S. Pat. No. 3,567,925 to Muga et al. entitled "An Improved Charged Particle Detector", a beam of charged particles passes through a thin scintillator film of the detector and then impinges upon a solid state surface barrier detector. Each of these devices requires that the charged particles impinge on a portion of the detector, and may result in an adverse change in the energy, direction, velocity, charge, or state of the electrically charged particles.

A system for detecting charged particles without destroying the charged particles is disclosed in U.S. Pat. No. 3,492,480 to Vogel entitled "System for the Detection Of Charged Particles". In this patent, a bunch of charged particles passes through sensor rings inducing a voltage across the terminals of a ringing circuit consisting of a capacitor and an inductor. This voltage excites oscillations in a ringing circuit with a linear buildup of oscillation amplitude. This system, however, may require synchronism between the pulses of electric charge from the charged particles and the frequency of the ringing circuit. For high sensitivity, this system may also require supercooling the resonating circuit or employment of resonators such as piezoelectric crystals.

An apparatus for monitoring the current comprised by a beam of charged particles such as a focused ion beam as used for ion implantation is disclosed in U.S. Pat. No. 3,857,090 to Chick entitled "Generation of Beams of Charged Particles". In this patent, the apparatus includes detector means that may comprise a toroidal coil or toroidal coil system surrounding the beam and producing an output voltage signal of magnitude in the order of millivolts. The detector means is responsive to the magnetic field of the beam and provides an output signal corresponding to the modulation of the strength of the magnetic field of the beam and therefore proportional to the beam current. Accordingly, this apparatus modulates the amplitude of the beam and therefore may not be adapted for monitoring individual charged particles or pulses of charged particles.

A system for scanning a charged particle beam, and monitoring and controlling of the source of the beam energy is disclosed in U.S. Pat. No. 4,687,936 to Mcintyre et el. entitled "In-Line Beam Scanning System". In this patent, the beam pulse amplitude is monitored by a toroid.

Notwithstanding the above mentioned devices for detecting beams of electrically charged particles, there continues to be a need for an apparatus and method for monitoring individual electrically charged particles and pulses of electrically charged particles without destroying the particles or significantly altering the energy, direction, velocity, charge, or state of the particles. In particular, there exists a need for an apparatus and method for monitoring individual charged particles and pulses of charged particles occurring at randomly spaced intervals in time.

SUMMARY OF THE INVENTION

It is therefore an object of the present invention to provide an apparatus and method for monitoring electrically charged particles without significantly altering the energy, direction, velocity, charge, or state of the particles.

It is another object of the present invention to provide an apparatus and method for monitoring individual electrically charged particles and short pulses of charged particles.

These and other objects are provided, according to the invention, by an apparatus comprising at least one coil defining an opening therethrough. This coil generates a bipolar signal responsive to an electrically charged particle pulse passing through the opening. The bipolar signal includes a first portion having a first polarity and a second portion having a second polarity. The apparatus also includes unipolar blocking means connected to the coil for passing the first portion of the bipolar signal having the first polarity and for blocking the second portion of the bipolar signal having the second polarity. In addition, monitoring means is connected to the unipolar blocking means. The monitoring means generates an output signal representative of a predetermined characteristic of the particle pulse based upon the first portion of the bipolar signal which is passed by the unipolar blocking means.

In one aspect of this invention, the unipolar blocking means is a diode connected between the coil and the monitoring means. In yet another aspect, the apparatus also includes a core and a semiconductor layer on the core, wherein the diode is formed in the semiconductor layer. In this aspect, the coil may comprise a metal portion on the semiconductor layer.

Preferably, the coil has a toroidal shape. The toroidal coil may include a plurality of windings electrically connected in parallel wherein each of the windings includes a plurality of conductive loops.

In another aspect of the present invention, the apparatus may comprise a plurality of coils which are serially arranged so as to define a predetermined path for passage of the electrically charged particle pulse through each respective opening of each respective coil. Alternately, the apparatus includes a plurality of coils arranged in parallel so as to define a plurality of predetermined paths, a respective path being defined by a respective opening of a respective coil. Furthermore, each of the coils in the parallel array may be followed by one or more serially arranged coils so that each path passes through a plurality of serially arranged coils.

Preferably, the unipolar blocking means is a plurality of diodes with a respective diode being connected between a respective coil and the monitoring means.

The monitoring means may include means for determining a velocity of the particle pulse, a charge of the particle pulse, and/or an energy of the particle pulse. Furthermore, the monitoring means may comprise a preamplifier and/or a signal discriminator.

In another embodiment of the present invention, the apparatus includes charged particle pulse accelerating means for projecting an electrically charged particle pulse along a predetermined path, and a plurality of toroidal coils. Each of these toroidal coils defines a respective opening therethrough with each of the openings positioned along the predetermined path. Each of these toroidal coils generates a bipolar signal responsive to the electrically charged particle pulse passing through the respective opening, and this bipolar signal includes a first portion having a first polarity and a second portion having a second polarity. A unipolar blocking means is connected to each of the toroidal coils for passing the first portion of each of the bipolar signals having the first polarity and for blocking the second portion of each of the bipolar signals having the second polarity. In addition, a monitoring means is connected to the unipolar blocking means for generating an output signal representative of a predetermined characteristic of the particle pulse based upon the first portion of the bipolar signals.

Still another embodiment of the present invention is a method of monitoring electrically charged particle pulses moving along a predetermined path. This method includes the step of projecting an electrically charged particle pulse through an opening in at least one toroidal coil thereby generating a bipolar signal comprising a first portion having a first polarity and a second portion having a second polarity. The first portion of the bipolar signal is passed while the second portion of the bipolar signal is blocked. An output signal representative of a predetermined characteristic of the particle pulse is generated based upon the first portion of the bipolar signal which is passed by the passing step. This method may also include the step of discriminating the output signal. In addition, the output generating step may include the step of determining one or more of a velocity of the particle pulse, a charge of the particle pulse, and an energy of the particle pulse.

The method and apparatus of the present invention are particularly adapted to detect and monitor individual charged particles and short pulses of charged particles which may be difficult to detect in the prior art due to the relatively small electrical charges of these particles and short pulses of particles. In addition, the apparatus is relatively compact, inexpensive, easy to construct, and simple to operate, maintain, and store.

In response to the passage of a charged particle pulse, the coil of the present invention generates a signal of a relatively short duration having both positive and negative components and a net average amplitude of zero. The unipolar blocking means, however, blocks either the positive or negative component of this signal resulting in a signal having a net positive or net negative amplitude. The unipolar blocking means thus provides a unipolar signal which can be used by the monitoring means to generate an output signal. The amplitude of the signal may be maximized by using a coil having a toroidal shape, and the duration of the signal may be increased by arranging a series of coils along the path of the charged particle or pulse of particles.

BRIEF DESCRIPTION OF THE DRAWINGS

FIG. 12 is a simplified schematic diagram of the coil of FIG. 11 wherein the parallel connection of windings are represented as a single winding.

FIG. 15 is a plan view of a plurality of coils arranged along a plurality of charged particle paths according to the present invention.

DETAILED DESCRIPTION OF A PREFERRED EMBODIMENT

The present invention will now be described more fully hereinafter with reference to the accompanying drawings, in which a preferred embodiment of the invention is shown. The invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
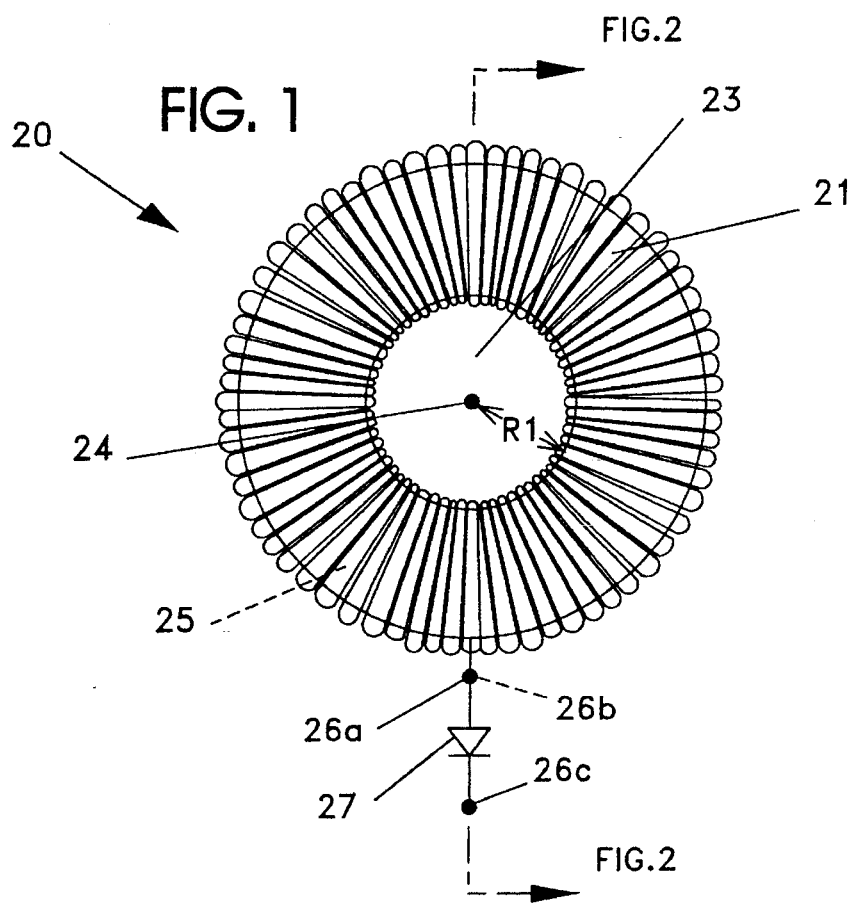
FIG. 1 is a plan view of a toroidal coil and diode according to the present invention.
Figure 2:
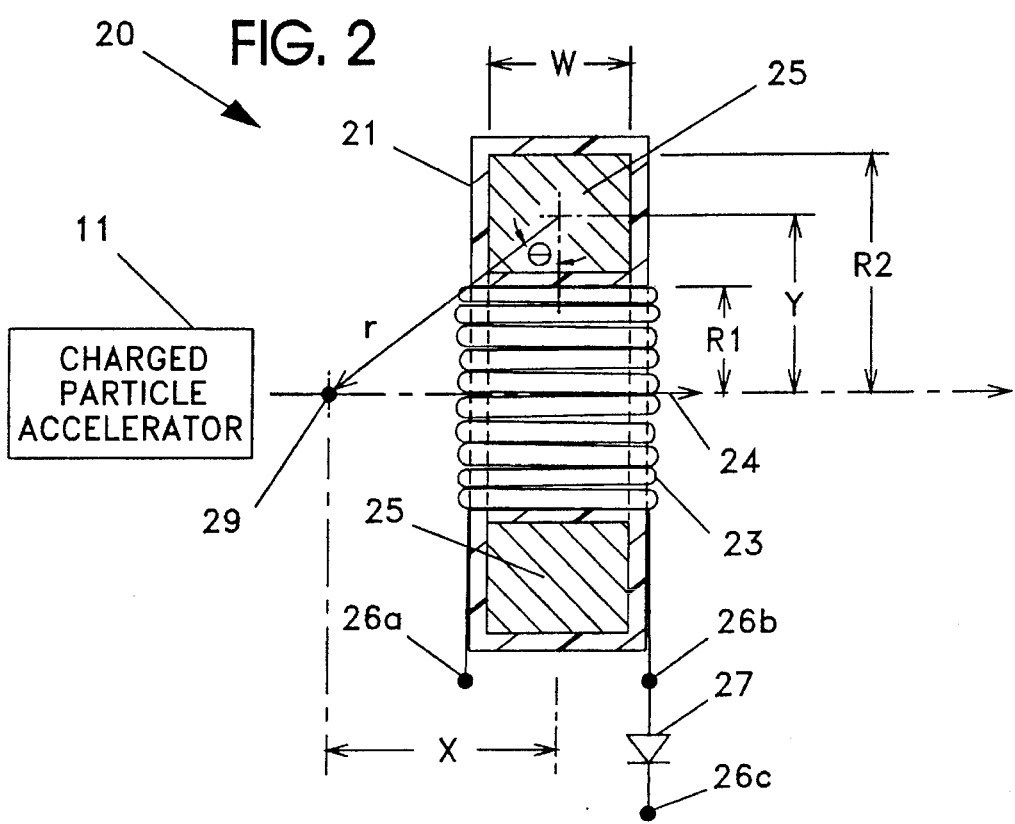
FIG. 2 is a cross-sectional side view of a toroidal coil and diode taken along section line 2 of FIG. 1 together with a charged particle pulse accelerator and a charged particle pulse having a single electrically charged particle.
Figure 3:
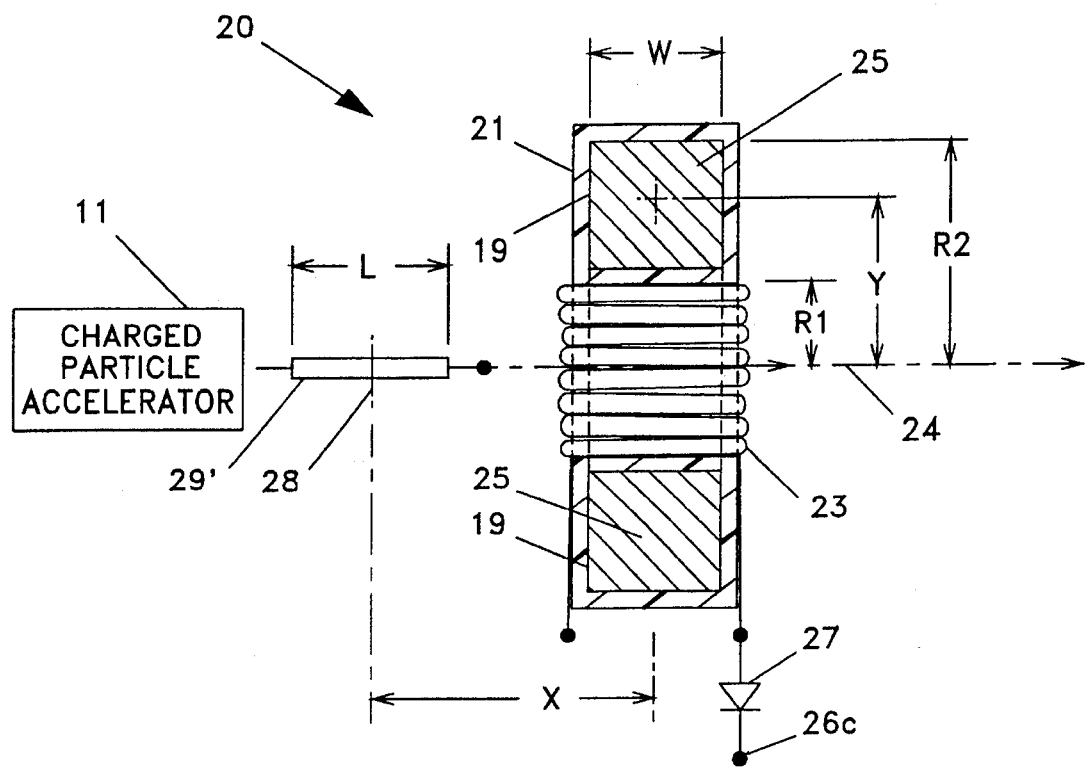
FIG. 3 is a cross-sectional side view of a toroidal coil and diode taken along section line 2 of FIG. 1 together with a charged particle pulse accelerator and a pulse having a plurality of charged particles.
Figure 4:
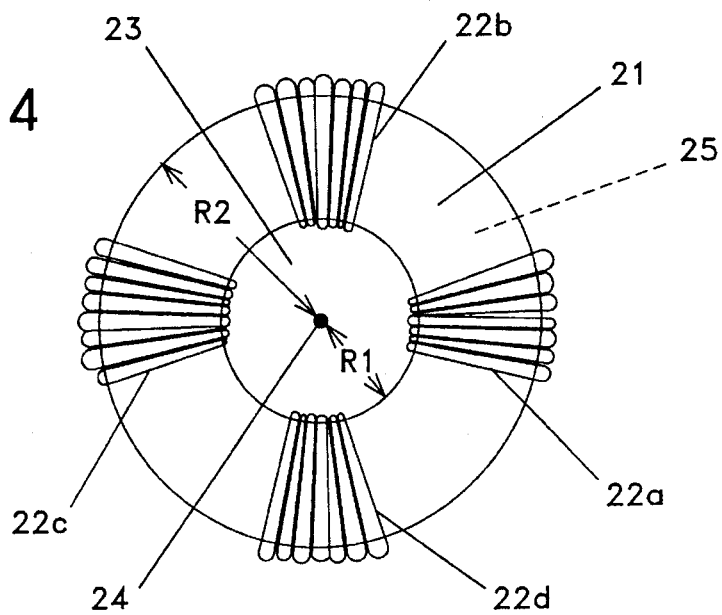
FIG. 4 is a plan view of a coil according to the present invention having a core and a single winding divided into four sectors.

One embodiment of the present invention comprises a coil defining an opening therethrough and unipolar blocking means connected to the coil. Preferably, the coil comprises a toroidal coil 20 wound on a ring shaped core 25, and the unipolar blocking means comprises a diode 27 as shown in FIG. 1. The coil includes a plurality of loops 21 closely wound on the core 25. As shown in FIGS. 2 and 3, the core 25 preferably has a rectangular cross-section shaped into a ring having an inner radius R1, an outer radius R2, and a width W. Alternately, the core may have a nonrectangular cross-section such as a circular cross-section. The core may also have one of various shapes such as a circular ring as shown in FIG. 4 or a hexagon for example. The diode 27 is preferably a fast-responding diode with a response time of less than 1 picosecond. The diode also preferably has a low forward resistance and a high reverse resistance.

Each conductive loop 21 preferably comprises a portion of fine insulated copper wire wound around the core 25. The wire preferably has a diameter of about 0.025 mm. Alternately, each conductive loop 21 of the coil 20 may be formed in a semiconductor layer. In this embodiment, a semiconductor layer 19 is formed on the core 25 as shown in FIG. 3. The conductive loops 21 may be formed by selectively doping the semiconductor layer 19 by diffusion, ion implantation or other doping methods known to those having skill in the art. Alternately, a conductive metal layer may be provided on the semiconductor layer by evaporation or other methods used in the fabrication of integrated circuits. The metal layer may be selectively etched so as to define the conducting coil. The diode 27 may also be formed in the semiconductor layer, thereby allowing the integration of the coil and unidirectional blocking means. The diode may comprise a p-n junction in this semiconductor layer. The core 25 preferably comprises a nonmagnetic material such as a plastic material in order to provide a fast signal response. In the alternative, a magnetic core may be used so as to provide a larger signal amplitude.

When an electrically charged particle 29 moves alongside a single electrically conductive loop 21 as shown in FIG. 2, a transient electric signal is induced in the loop 21. The voltage induced in the loop as the particle approaches can have either a positive or negative polarity depending on the polarity of the charged particle and the direction of approach. The voltage induced in the loop as the particle recedes away from the loop will be of the opposite polarity. As a result, the net average voltage signal produced by the loop in response to the particle motion may be 0 unless the portion of the signal having either the positive or negative polarity is blocked.

The magnetic flux induced in an individual electrically conducting planar loop 21 in response to an electrically charged particle moving in the plane of the loop, can be written as:

$$\Phi = 10^{-7} AES(\sin\theta)/r^2.$$

In this equation, A is the area of the loop, E is the charge of the particle, and S is the constant speed of straight line motion in the plane of the loop at the time instant when the particle has coordinates (r, θ) relative to the center of the loop taken in the polar coordinate system. All quantities used in this equation are to be taken in the standard international system of units. The motion of the particle 29 along the path 24 results in a change of the values of r and θ. As the values of r and θ change, so does the flux Φ induced in the loop 21. These changes in flux induce an electrical voltage in the loop 21, and this voltage can be obtained by algebraic differentiation of the flux function with time as a variable. This voltage can be expressed mathematically by the equation:

$$v = -3 \cdot 10^{-7} AES^2 xy/((x^2+y^2)^{5/2}).$$

In this equation, a conversion has been made from the polar coordinate system to the Cartesian Coordinates System using the conventional mathematical approach. This mathematical relationship is a simplified version because the relativistic effects have not been taken into account.

Similar formulas may be derived to determine the voltage induced in a conductive loop 21 by a pulse 29' of charged particles moving along a path 24 and having a centerpoint 28 as shown in FIG. 3. The pulse 29' may be projected along the path 24 by the charged particle accelerator 11. This voltage may be expressed algebraically by the equation:

$$\Phi = -3 \cdot 10^{-7} AIS(L/Y)(f'-g').$$

In this equation, A is the area of the loop 21, I is the current of the pulse in amperes, and L is the length of the pulse in meters. The variables f' and g' are the x-differentials of the algebraic functions f and g where f and g are functions of the pulse length L, and the position coordinates x and y of the centerpoint 28 of the pulse 29' relative to the center of the loop. The functions f and g may be expressed as:

$$f = (x+L/2)/((x+L/2)^2+y^2)^{1/2}, \text{ and}$$

$$g = (x-L/2)/((x-L/2)^2+y^2)^{1/2}.$$

Typically, the signal generated in the loop 21 by a pulse 29' of charged particles is larger than the signal generated by a single charged particle. The voltage induced in the conductive loop 21 may be used to indicate the passage of a charged particle 29 or pulse of charged particles 29' as shown in FIGS. 2 and 3. If the toroidal coil 20 includes n loops wound in series with the plane projections of all of the loops intersecting along the path 24 of the particle motion, the voltage induced will be equal to n times the voltage induced in a single loop. This relationship may be expressed by the following equation:

$$V = nv,$$

where n is the number of loops and v is the voltage defined by the equations discussed above.

The force exerted mutually between a charged particle in motion and the loop or loops because of the induced electrical current is so small that no perceivable effect should result on the particle motion. Similarly, the energy liberated in the loop is extremely small so that no recognizable reduction in the energy of the charged particle should occur.

A charged particle 29 or pulse of charged particles 29' moving along a path 24 through the center of the opening 23 will generate a bipolar signal in each of the loops 21. As discussed above, the magnitude of this bipolar signal is directly proportional to the number of loops 21 included in a toroidal coil 20. It is therefore advantageous to include a large number of such loops. The self-inductance of the coil, however, also increases with increasing numbers of loops 21. Accordingly, it is advantageous to have the loops 21 form a plurality of windings, each winding made of a number of serially wound loops, and to connect the windings in parallel.

As shown in FIG. 4, each winding in a preferred embodiment may comprise 24 loops further divided into four sectors 22a–22d having six loops per sector. The loops within the winding are formed by winding a single wire around the core, and the sectors 22a–22d of loops are spaced around the core at 90° intervals. Accordingly, a toroidal coil having 40 windings with 24 loops per winding could have 960 individual conductive loops 21. Each of these windings may be connected in parallel so as reduce the overall inductance of the toroidal coil while maintaining an adequate signal strength. The signal strength in this case can be twelve times that due to a single loop, whereas the self-inductance may be only 3.6 times that due to a single loop. Alternately, the 24 loops of a winding may be positioned uniformly around the core without sectoring. The elimination of sectoring may further reduce the coil inductance.

Referring again to FIG. 1, terminals 26a and 26b provide electrical connections to opposing ends of each winding. The core also defines an opening 23 which may be arranged to allow passage of a charged particle or pulse of particles passing along a path 24.

Unipolar blocking means such as a diode 27 is connected to one of the terminals 26a or 26b, as shown in FIG. 1, so as to block a portion of the bipolar signal having a predetermined polarity. Accordingly, any signal generated by the combination of the toroidal coil 20 and the unipolar blocking means will have only a single polarity. As will be understood by those having skill in the art, the unipolar blocking means may comprise a rectifying element such as a commercially available diode 27. A cross section of the toroidal coil 20 and the diode 27 of FIG. 1 taken along section line 2 is shown in FIGS. 2 and 3. In FIG. 2, there is also shown a charged particle 29 which has been projected by the charged particle accelerator 11 along the path 24 through the opening 23. As previously discussed, a bipolar signal is generated by the coil 20 in response to the passage of the particle 29 through the opening 23. This bipolar signal comprises a first portion with a first polarity and a second portion with a second polarity. This bipolar signal is generated across terminals 26a and 26b. By including the diode 27, either the first or second polarity may be blocked. Accordingly, the signal generated across terminals 26a and 26c is a unipolar signal having a net positive or negative amplitude.

Figure 5:
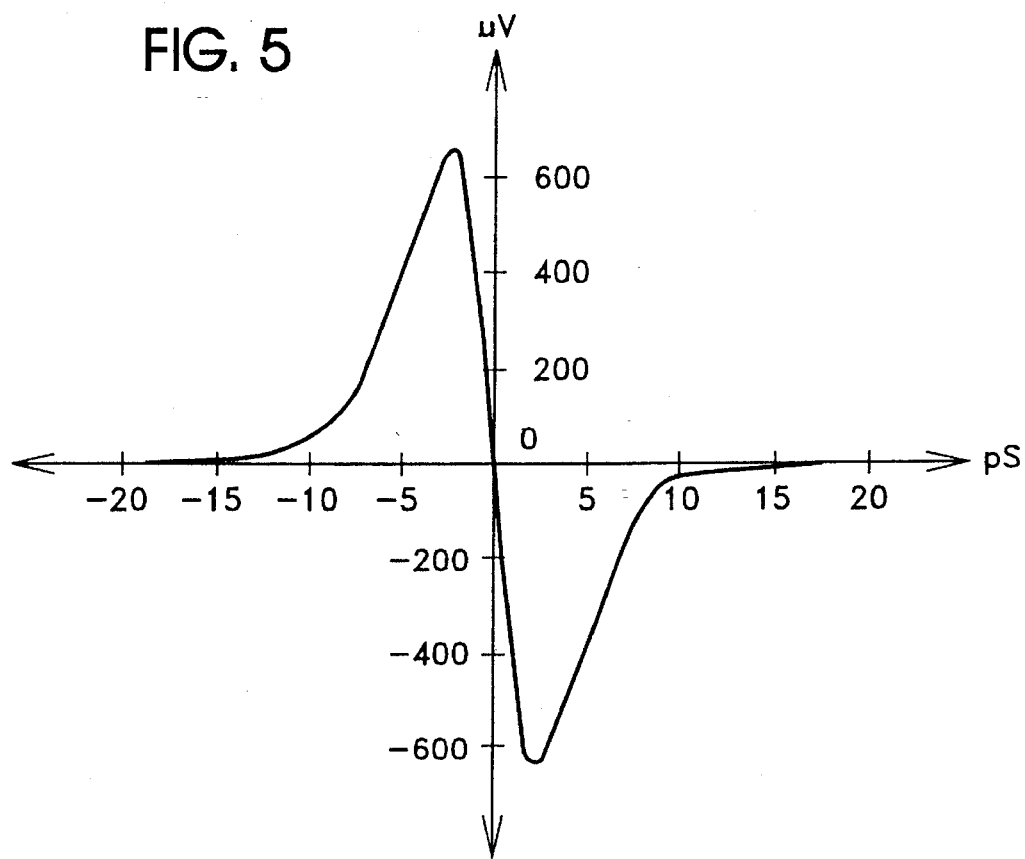
FIG. 5 illustrates the waveform of a bipolar signal generated by the toroidal coil of FIG. 2 in response to the passage of a charged particle.
Figure 6:
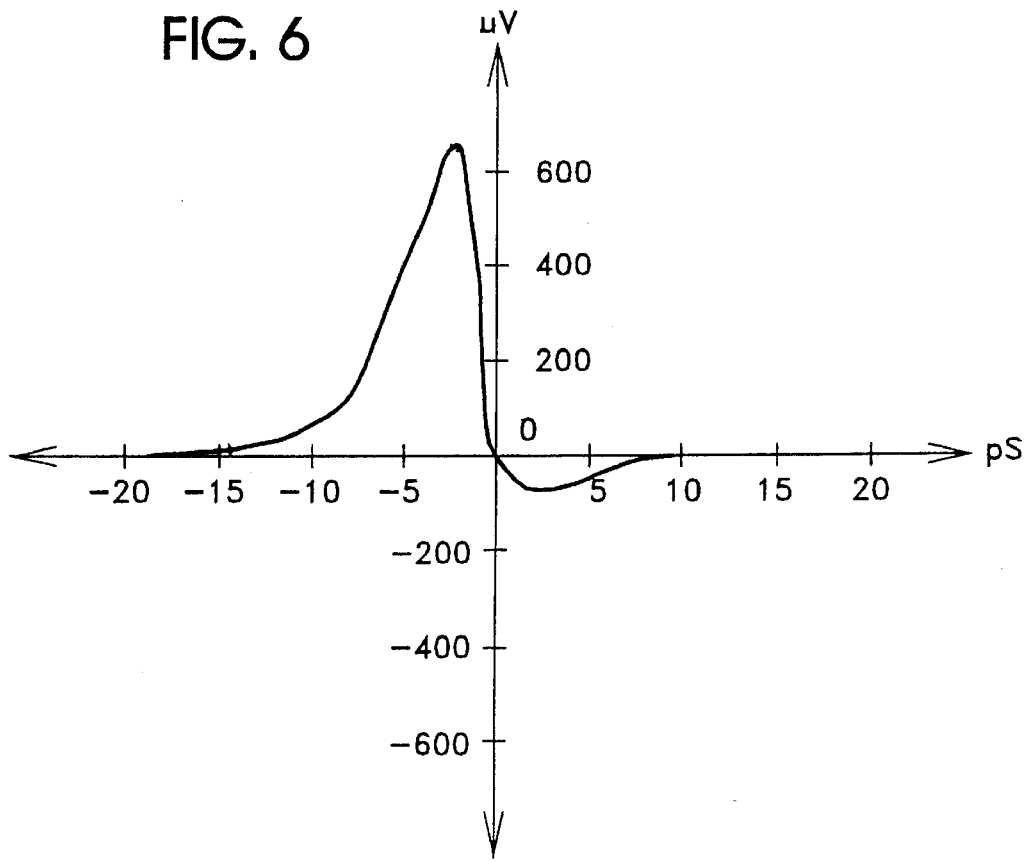
FIG. 6 illustrates the waveform of a unipolar signal generated by the combination of the toroidal coil and diode of FIG. 2 in response to the passage of a charged particle.

A toroidal coil, as shown in FIG. 2, designed to monitor individual charged particles, may have an inner radius R1 of 1 mm, an outer radius R2 of 2 mm, and a width W of 1.4 mm. These dimensions are determined so as to ensure a signal having an adequate amplitude. For a toroidal coil including 40 windings of 24 loops each and a particle 29 with an electrical charge of 50 natural units ($8.011 \times 10^{-18}$C) moving along path 24 at a speed close to that of light, the voltage waveform generated across terminals 26a and 26b is illustrated in FIG. 5. This waveform has a first portion with a positive polarity and a second portion with a negative polarity and these portions are symmetric about the origin. The duration of each portion of the signal is defined as the full width of the signal at half of the maximum amplitude, and this duration may be approximately 6 picoseconds. By running the signal through the diode 27, either the first portion or the second portion of the signal may be blocked. As will be understood by those having skill in the art, the polarity of the first and second portions of the signal may be reversed by reversing the direction of the motion of the charged particle 29 along the path 24, or by projecting a particle having the opposite charge. FIG. 6 illustrates the positive waveform generated across terminals 26a and 26c as a result of the diode 27.

In order to increase the magnitude of signals generated, the inner radius R1 of the toroidal coil may be reduced. In order to increase the space available for the passage of the charged particle, the inner radius R1 of the coil may be increased. Various dimensions for a toroidal coil are listed below in Table 1 along with the resulting signal amplitude corresponding to an electrically charged particle having an electrical charge of 50 natural units ($8.011 \times 10^{-18}$ C) passing along a path through the opening in the toroidal coil at close to the speed of light. The toroidal coil used to generate this table has 40 windings connected in parallel wherein each winding includes 24 conductive loops.

TABLE 1

Amplitude of the voltage signal from a single toroidal coil including 40 windings with 24 lops per winding for a particle having an electrical charge of 50 natural units ($8.011 \times 10^{-18}$ C) moving at close to the speed of light.

| Average Radius (mm) | Inner Radius $R_1$ (mm) | Outer Radius $R_2$ (mm) | Width W (mm) | Signal Amplitude (microvolts) |
|---|---|---|---|---|
| 1.5 | 0.5 | 2.5 | 1 | 1800 |
| 1.5 | 0.5 | 2.5 | 1.4 | 2250 |
| 1.5 | 1.0 | 2.0 | 1 | 470 |
| 1.5 | 1.0 | 2.0 | 1.4 | 610 |
| 2.0 | 1.5 | 2.5 | 1 | 190 |
| 2.0 | 1.5 | 2.5 | 2 | 300 |
| 2.0 | 1.0 | 3.0 | 1 | 540 |
| 2.0 | 1.0 | 3.0 | 2 | 860 |
| 2.5 | 2.0 | 3.0 | 1 | 100 |
| 2.5 | 2.0 | 3.0 | 2 | 170 |
| 2.5 | 1.5 | 3.5 | 1 | 240 |
| 2.5 | 1.5 | 3.5 | 2 | 420 |
| 3.0 | 2.5 | 3.5 | 1 | 60 |
| 3.0 | 2.5 | 3.5 | 2 | 100 |
| 3.0 | 2.0 | 4.0 | 1 | 130 |
| 3.0 | 2.0 | 4.0 | 2 | 240 |

When using a toroidal coil to monitor a pulse of charged particles 29' as shown in FIG. 3, the signal generated is generally much larger than that generated by a single charged particle due to the larger total charge of the pulse. Accordingly, a coil with a larger inner radius R1 may be used thereby providing a larger opening for the pulse to pass through while still maintaining an adequate signal strength. A toroidal coil with an inner radius R1 of 5.0 mm or greater is therefore feasible. In a preferred embodiment, a toroidal coil for monitoring pulses of charged particles has an inner radius of 4.5 mm, an outer radius of 5.5 mm, and a width of 4 mm. This coil has 80 windings with each winding having 4 sectors of 3 loops each. Accordingly, 960 loops of wire with a thickness of 0.025 mm can be accommodated in a single layer over the inner edge of the coil. As before, the loops within each winding are formed from a single wire and the windings are connected in parallel. The signal strength in this case may be 12 times that due to a single loop, whereas the self-inductance may be only 45 percent of that due to a single loop.

Figure 7:
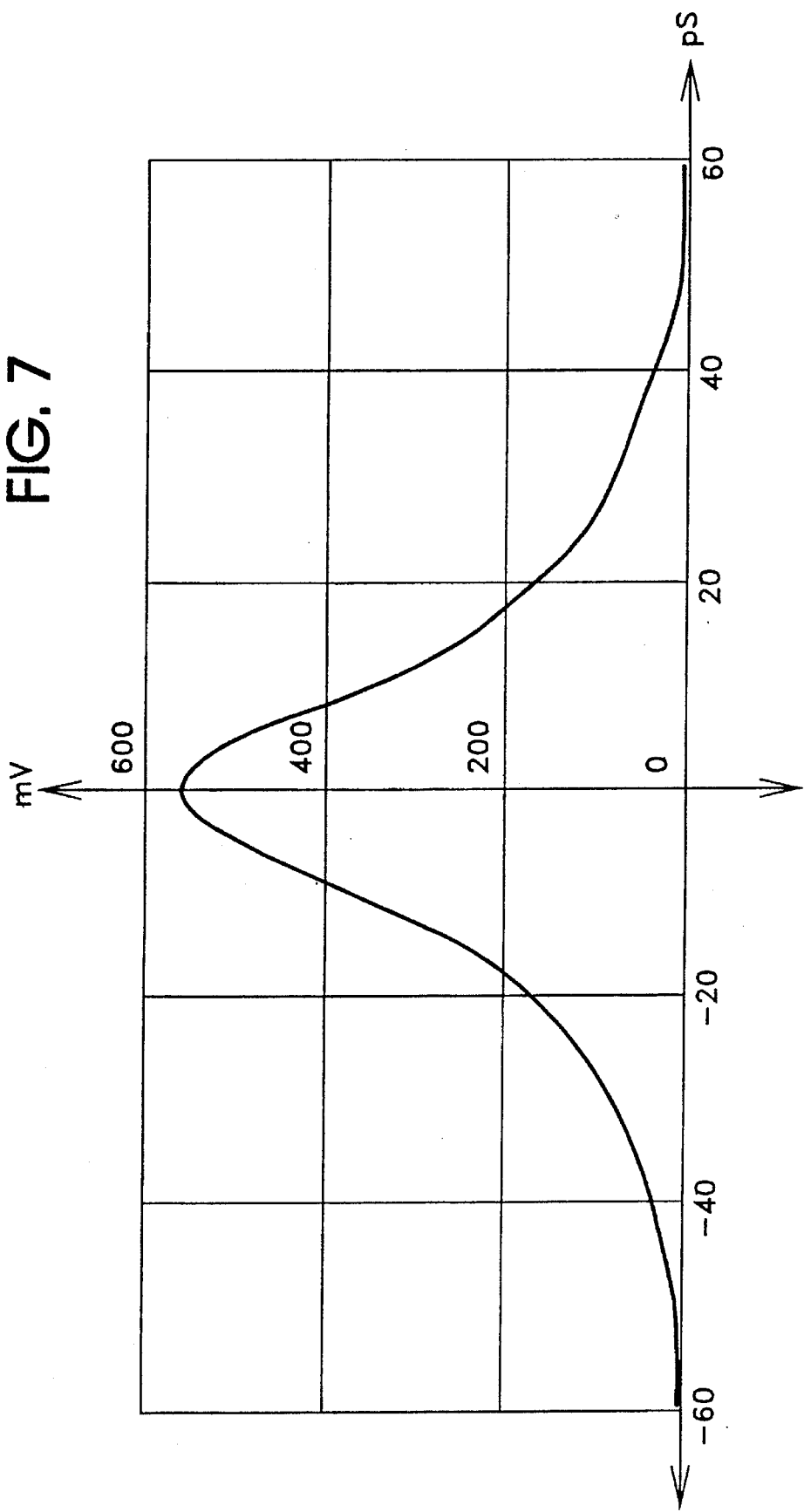
FIG. 7 illustrates the waveform of a unipolar signal generated by the combination of the toroidal coil and diode of FIG. 3 in response to the passage of a pulse including a plurality of charged particles.

FIG. 7 illustrates the positive portion of the signal generated by the above-described toroidal coil and diode when a pulse of charged particles having a 10 ma current and a 10 cm pulse length passes through the opening at a speed close to that of light. As shown, the amplitude is in excess of 500 mv. A negative portion of the signal can be obtained by reversing the direction of the unipolar blocking means. The dimensions of various toroidal coils and the resulting signal amplitudes are listed in Table 2. The signal amplitudes correspond to a pulse of charged particles having 10 ma of current and a 10 cm pulse length moving at close to the speed of light. It will be understood that the term "electrically charged particle pulse" will be used in the remainder of this specification in its broadest sense so as to include a pulse having a single electrically charged particle or a pulse having a plurality of electrically charged particles.

TABLE 2

Amplitude of the voltage signal from a single toroidal coil including 80 windings with 12 loops per winding for a pulse of charged particles with a 10 ma current and a 10 cm pulse length moving at close to the speed of light.

| Average Radius (mm) | Inner Radius $R_1$ (mm) | Outer Radius $R_2$ (mm) | Width W (mm) | Signal Amplitude (millivolts) |
|---|---|---|---|---|
| 3.0 | 2.5 | 3.5 | 2 | 780 |
| 3.0 | 2.5 | 3.5 | 4 | 1360 |
| 4.0 | 3.0 | 5.0 | 2 | 930 |
| 4.0 | 3.0 | 5.0 | 4 | 1690 |
| 5.0 | 4.5 | 5.5 | 4 | 540 |
| 5.0 | 4.5 | 5.5 | 6 | 750 |
| 6.0 | 5.0 | 7.0 | 4 | 780 |
| 6.0 | 5.0 | 7.0 | 6 | 1100 |
| 8.0 | 7.5 | 8.5 | 6 | 320 |
| 8.0 | 7.5 | 8.5 | 8 | 410 |
| 9.0 | 8.0 | 10.0 | 6 | 510 |
| 9.0 | 8.0 | 10.0 | 8 | 660 |
| 10.0 | 9.5 | 10.5 | 8 | 260 |
| 10.0 | 9.5 | 10.5 | 10 | 310 |
| 11.0 | 10.0 | 12.0 | 8 | 450 |
| 11.0 | 10.0 | 12.0 | 10 | 540 |

As discussed above, the magnitude of the signal generated by the toroidal coil may be increased by providing a plurality of loops per winding on the toroidal coil and also by minimizing the dimensions of the coil. Furthermore, a signal having a single polarity and therefore a net magnitude may be obtained by providing a unipolar blocking means, such as a diode. It may also be desired to provide a signal having a relatively long duration.

Figure 8:
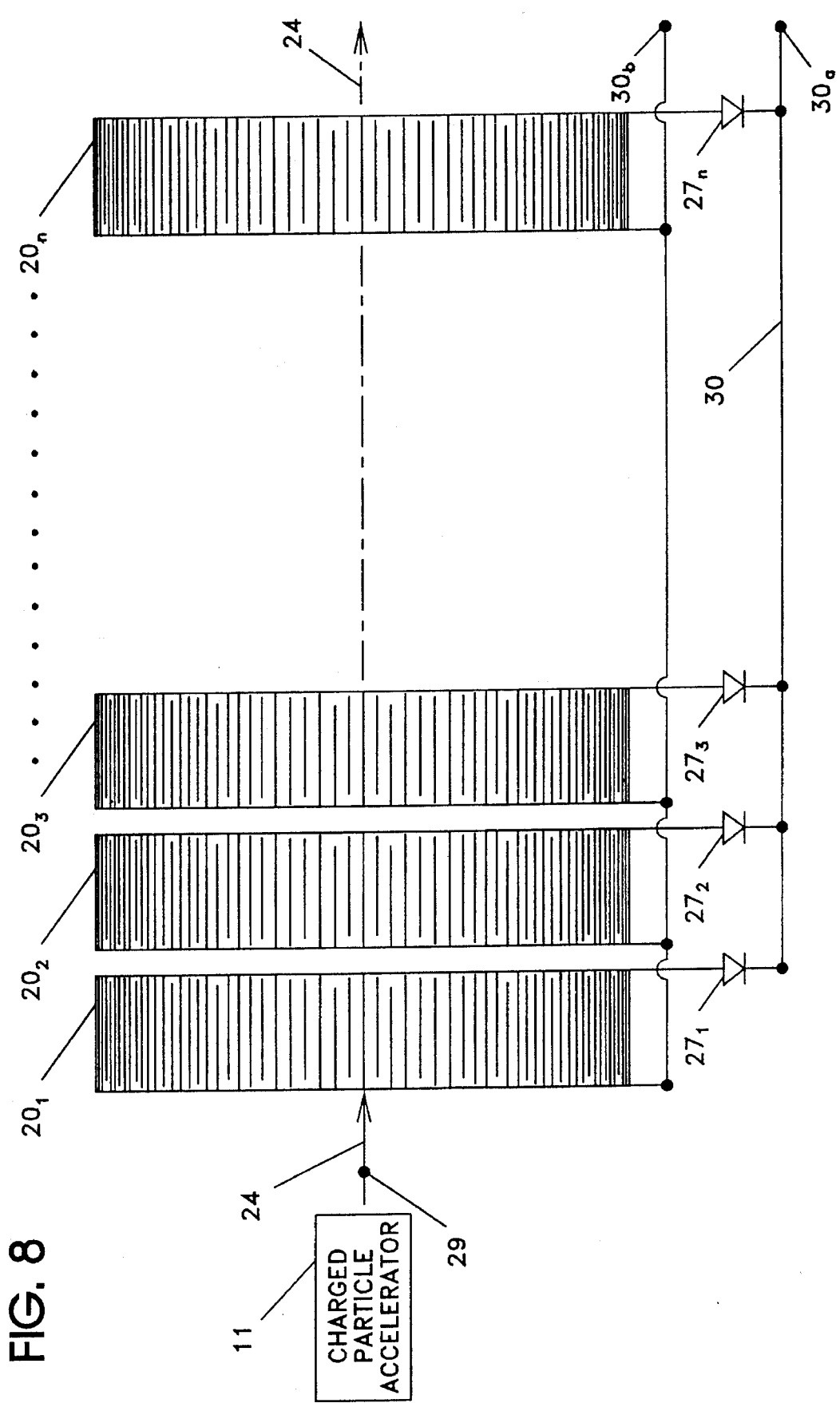
FIG. 8 is a side view of a plurality of coils aligned along the path of a charged particle pulse according to the present invention.
Figure 9:
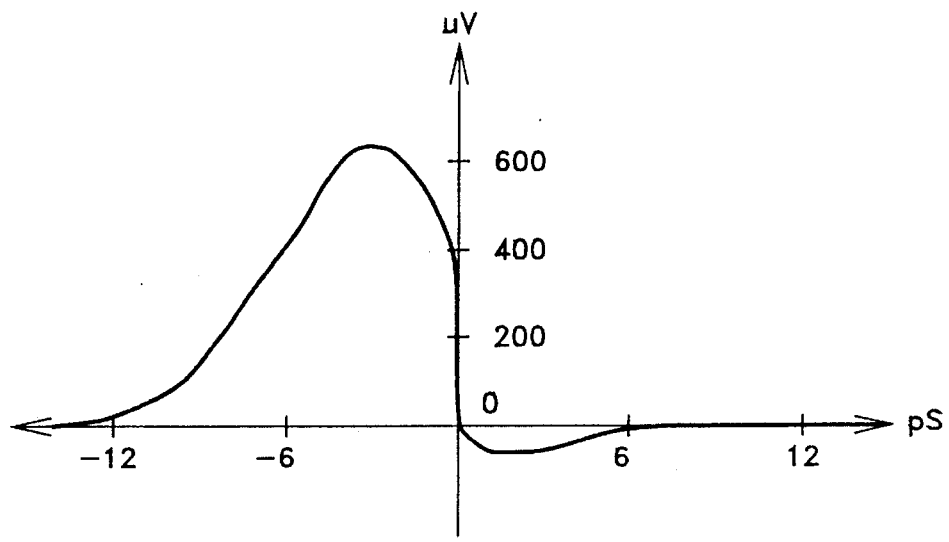
FIG. 9 illustrates the waveform of a signal generated by a single toroidal coil and diode as shown in FIG. 8.
Figure 10:
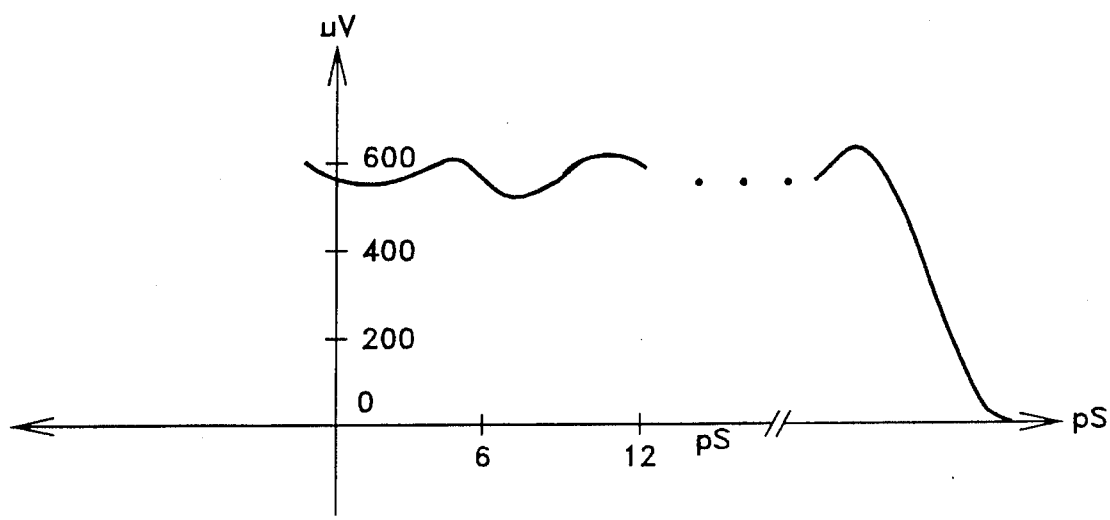
FIG. 10 illustrates the waveform of a signal generated by the combination of a plurality of coils and diodes as shown in FIG. 8.

The duration of the signal may be increased by providing a plurality of toroidal coils $20_{1-n}$ wherein each of the toroidal coils defines a respective opening therethrough as discussed above. Such an apparatus is illustrated in FIG. 8. The charged particle accelerator 11 projects the electrically charged particle along the path 24. Each of the toroidal coils $20_{1-n}$ is serially arranged along the path 24 so that the charged particle passes through each of the toroidal coils in the series. Accordingly, the particle 29 passes sequentially through the opening of each of the toroidal coils as it moves along path 24. As the particle 29 passes through each coil, the coil and respective diode produce the signal illustrated in FIG. 9. Because the particle passes sequentially through the coils, each coil and diode combination sequentially produces a signal substantially identical to that illustrated in FIG. 9 but delayed in time. The delay between the signals from adjacent toroidal coils could be varied beyond the delay resulting from the delay in transmit of the charged particle pulse between the adjacent toroidal coils, by introducing an electronic delay line between the terminals 26c of a pair of adjacent toroidal coils. Because each diode is connected to a common line, these sequential signals are summed to produce an extended signal across terminals 30a and 30b. This extended signal waveform is illustrated in FIG. 10. Each peak along the waveform corresponds to the passage of a charged particle pulse through a respective coil $20_{1-n}$.

Accordingly, the duration of the extended signal is directly proportional to the number of toroidal coils aligned in series. In this embodiment, all coils and diodes are arranged so as to produce individual signals having a single common polarity. The increased duration of the pulse may allow the signal to be recorded by conventional monitoring equipment. The duration of the pulse may also be used to determine a speed of the particle or pulse of particles. By connecting 700 toroidal coils in series with each coil having an inner radius of 1.0 mm, and an outer radius of 2.0 mm and a width of 1.4 mm, a particle having an electric charge of 50 natural units ($8.011 \times 10^{-18}$ C) and moving at close to the speed of light may produce a signal lasting for several nanoseconds.

Figure 11:
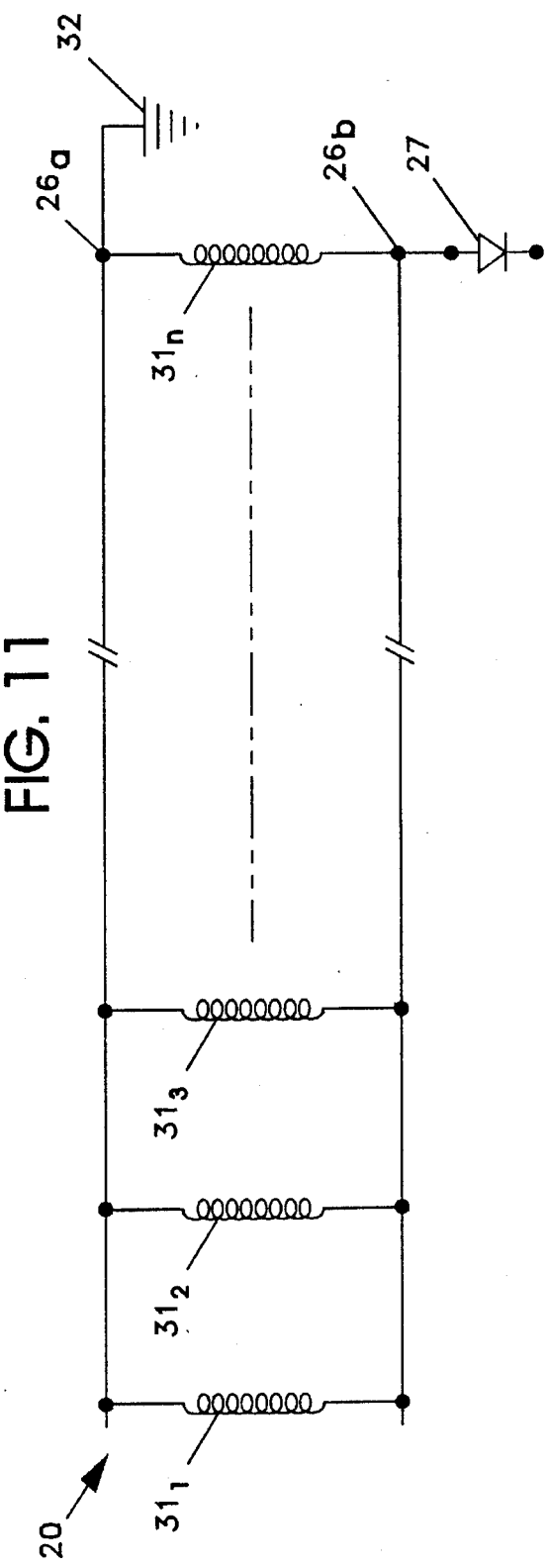
FIG. 11 is a schematic diagram of a single toroidal coil including a plurality of windings according to the present invention.
Figure 13:
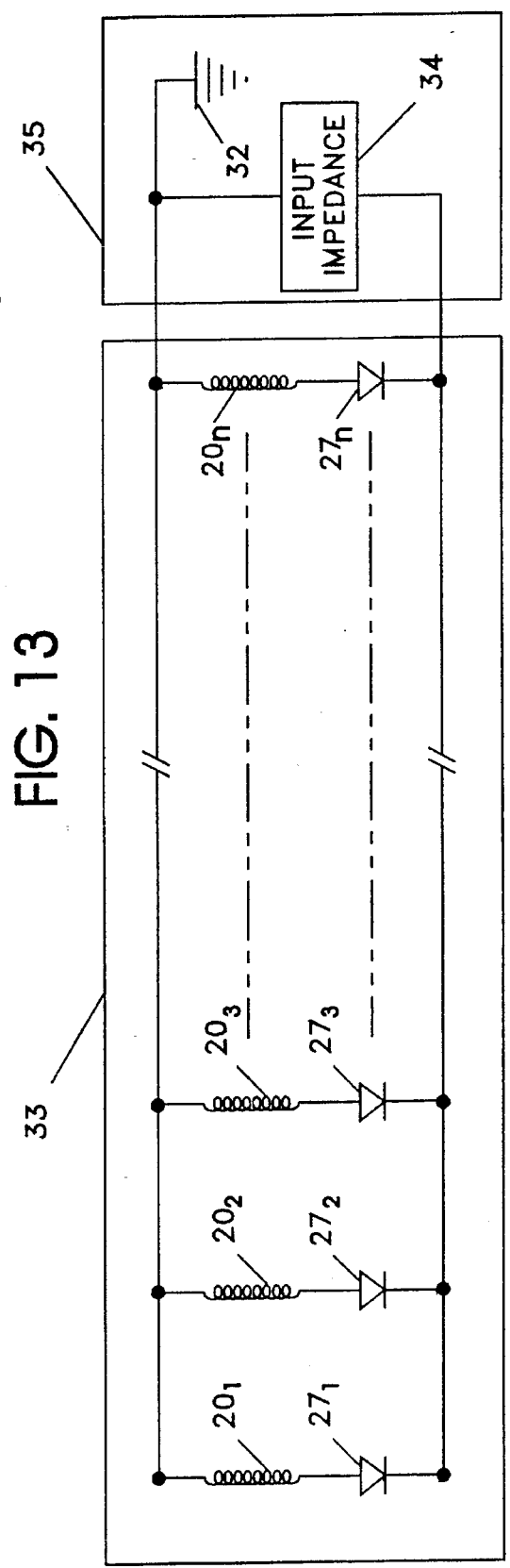
FIG. 13 is a schematic diagram of a plurality of coils and diodes connected in parallel with a preamplifier according to the present invention.

The various elements of the particle monitor are illustrated schematically in FIGS. 11–13. A schematic diagram of a single toroidal coil 20 is shown in FIG. 11. The coil 20 includes a plurality of windings $31_{1-m}$, and each of these windings is electrically connected in parallel. As discussed above, each winding includes a plurality of conductive loops formed by winding a wire around the core, and these loops may be further divided into sectors. In a preferred embodiment, the toroidal coil has 40 windings $31_{1-40}$ and each winding includes 24 loops. The windings are connected in parallel to form a coil having two terminals, 26a and 26b. One of these terminals is connected to a common ground 32 while the other terminal is connected to the diode 27.

As discussed above, the diode blocks one portion of the signal having one polarity while passing a second portion of the signal having the opposite polarity. The electrical resistance of the wire used to form the windings is estimated to be a fraction of 1 ohm and therefore negligible. The parallel connection of the windings $31_{1-m}$ minimizes the inductance of the toroidal coil 20.

The parallel combination of the windings $31_{1-m}$ is illustrated in FIG. 12 as a toroidal coil 20. This simplified diagram is used to allow the illustration of a plurality of toroidal coils as in FIG. 13. In FIG. 13, each toroidal coil $20_{1-n}$ is connected in series with a respective diode $27_{1-n}$, and these series combinations of coils and diodes are connected in parallel so as to define a toroidal coil assembly 33. As discussed above, the electrical resistance of a single toroidal coil is a fraction of 1 ohm which is considered to be negligible.

In a preferred embodiment, the assembly 33 includes 700 coils and diodes. In this embodiment, each toroidal coil includes 40 windings with 24 loops per winding. The effective resistance of the assembly 33 will be approximately the net forward resistance of the 700 diodes connected in parallel. This forward resistance should be small so that the effective load impedance is dominated by and approximately equal to the input impedance 34 of the preamplifier 35. The preamplifier preferably has a fast response and high sensitivity. The preamplifier 35 preferably has an input impedance 34 of 50 ohms. This device having 700 toroidal coils would have a self-inductance of approximately 12 picohenries. With an amplifier input impedance of 50 ohms, this would result in a characteristic response time of a fraction of a picosecond for a toroidal coil when current flows in the direction of diode conduction. This response is adequate. The duration of the signal from the assembly 33 can be several nanoseconds, and the signal strength can be several hundred microvolts in the case of a charged particle monitor as seen in Table 1. The speed of the response may be increased by connecting a small inductance in parallel with each toroidal coil $20_{1-n}$. That is, a small inductance is placed across the terminals of each coil. State of the art preamplifiers can provide response times of less than a nanosecond and sensitivities of 100 μv and can amplify the signals from the assembly 33.

In another embodiment, the assembly 33 includes 250 toroidal coils having an inner radius of 4.5 mm and an outer radius of 5.5 mm and a width of 4 mm. In this embodiment, each toroidal coil has 80 windings with each winding having 12 loops. The net inductance of this assembly is 30 picohenries which is acceptable to provide an adequately fast current response to the voltage signal. The signal can have a duration of several nanoseconds and a strength of several hundred millivolts for pulsed beam monitoring as seen in Table 2. In an alternate embodiment, a plurality of toroidal coils may be spaced apart along a linear path with the terminals of the toroidal coils connected in parallel. In this alternate embodiment, a single diode is connected to the parallel combination of toroidal coils.

Figure 14:
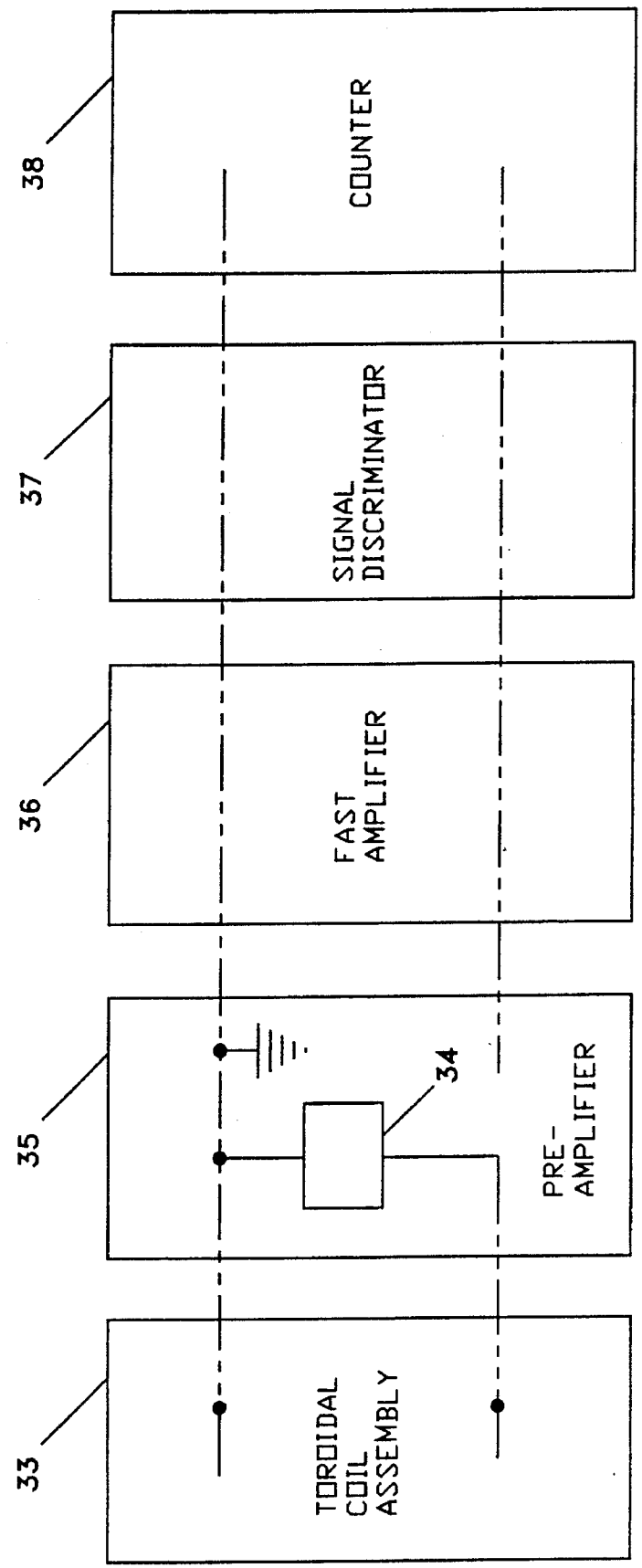
FIG. 14 is a block diagram of one embodiment of the present invention.

The toroidal coil assembly 33 may be connected to a series of signal monitoring devices as illustrated in FIG. 14. In a preferred embodiment, the assembly 33 including a plurality of toroidal coils and diodes is electrically connected to a preamplifier 35 having a predetermined input impedance 34. The input impedance 34 is 50 ohms in the preferred embodiment. The preamplifier 35 may be used to sample the electrical signal produced by the plurality of toroidal coils included in the assembly 33. The signal is quickly amplified by the preamplifier and may be further amplified by a fast amplifier 36. A signal discriminator 37 may be used to compare the signal to a threshold value. If the signal exceeds the threshold value, an appropriate signal may be sent on to the counter 38. In one embodiment, the counter is used to count the electrically charged particles passing through the coil assembly. Alternately, the counter may be used to monitor the frequency of electrically charged particles passing through the assembly. Lead wires connecting the various components of this apparatus should be as short as possible to avoid stray inductances. Twisted lead wires may also be used. Preferably, the toroidal coils are identical and the lead lengths are equal so that spurious delays between the signals from the various toroidal coils may be avoided.

The electronic components of this apparatus are commercially available. For example, the preamplifier may be a Model 9306 preamplifier produced by EG&G Ortec of Oak Ridge, Tenn. The fast amplifier may be a Model 579 Fast Amplifier also produced by EG&G Ortec. The signal discriminator may be a Model 935 Signal Discriminator also produced by EG&G Ortec. The pulse counter may be a Model TC 534 Pulse Counter-Timer produced by Tennelec of Oak Ridge, Tenn.

Alternate techniques for monitoring the coils may also be used. For example, a fast sensitive electronic switching device such as a tunnel-diode based circuit could be connected to the toroidal coil so that the circuit could be triggered by the signal generated by the toroidal coil in response to the moving charged particle. The output of the switching circuit could be amplified and recorded.

The apparatus of the present invention is preferably used to monitor particles projected by a charged particle accelerator 11, as shown in FIGS. 2, 3 and 8. The charged particle accelerator is used to project electrically charged particle pulses, and may comprise a pair of electrically charged plates. The charged particle accelerator, however, may comprise any device for accelerating charged particles to high energies, such as a cyclotron, a betatron, a Van de Graaff generator, a linear accelerator, etc.

In a preferred embodiment, the particle pulses are projected through an evacuated tube, and the coils of the apparatus are maintained in the evacuated tube. The coils of this system may be shielded from background magnetic fields by surrounding it with metallic covers having high magnetic permeability. The coils may also be maintained at very low temperatures so as to be superconducting. Furthermore, the electrical connections between various components may be made with shielded cables to further reduce noise. The connection wires and cables should also be as short as possible in order to maximize the speed of electrical response.

The present invention can be used for a number of other purposes as well. In the study of materials, positrons impinge upon a material target and are annihilated. It is desirable to use the present invention to detect and identify a single positron or a pulse of positrons before the particle or pulse is annihilated. This information will allow a correlation between the particle annihilated and the annihilation process providing a clearer understanding of the intervening period.

In another application, nuclear reactions are studied by bombarding atomic nuclei with fast moving charged particles. The present invention could be used to identify the charged particles without adversely affecting the energy or motion of the charged particles. The present invention may also be used to monitor the speed and charge of particles and pulses of particles passing through the assembly. Two spaced-apart toroidal coils could be used to time the passage of a charged particle or pulse of charged particles from one point to another providing a measure of speed. The magnitude of the signals generated could be used to determine the charge.

The particle monitor of the present invention may also be used to determine the charge of a particle or pulse of particles, the polarity of the charge, and the frequency of charged particles or pulses of particles. Furthermore, the apparatus of the present invention could be used to count charged particles or pulses of charged particles. Accordingly, the apparatus of the present invention may be used for particle counting, electronic charge determination, particle identification, heavy ion studies, the study of material science, the study of nuclear and radiation science, the study of elementary particle physics, and laboratory instruction.

In yet another embodiment of the present invention, a plurality of toroidal coils $41_{1-k}$ may be arranged so as to indicate the position of a charged particle. As shown in FIG. 15, the coils may be arranged in an array 40, wherein each opening $42_{1-k}$ defines a unique path of travel through the array for a charged particle. Preferably, each coil is connected to a diode as shown in FIG. 1, and each diode is connected to monitoring means as shown in FIG. 14. A charged particle penetrating the array will pass through the opening of a single toroidal coil in the array. This toroidal coil will generate a signal in response to the passage of the charged particle through the respective opening, thereby indicating both the passage of the particle through the array and the path of the particle through the array. By including a large number of small, closely spaced toroidal coils, the position of a path of particle motion may be resolved to within a small area.

As will be understood by those having skill in the art, the array may have a planar or nonplanar form. In one embodiment, the array may form a sphere or a portion of a sphere. Accordingly, this array of coils may be used to monitor charged particles projected in random directions such as particles which are the product of particle collisions. While FIG. 15 shows a plurality of cores having a circular shape, coils having other shapes may be used to eliminate gaps between coils. For example, hexagonal, rectangular or triangular shaped coils could be used to eliminate the gaps. Furthermore, each coil in the array may be followed by one or more serially arranged coils so that each path passes through a plurality of serially arranged coils.

Referring again to FIG. 2, the present invention also encompasses a method of monitoring electrically charged particles moving along a predetermined path. In this method, an electrically charged particle 29 is projected through an opening 23 in a toroidal coil 20 thereby generating a bipolar signal across terminals 26a and 26b. As shown in FIG. 5, the bipolar signal includes a first portion having a first polarity and a second portion having a second polarity. The diode 27 passes the first portion of the bipolar signal having the first polarity, and blocks the second portion of the bipolar signal having the second polarity. As shown in FIG. 6, the signal across terminals 26a and 26c is essentially the same as the first portion of the bipolar signal shown in FIG. 5. An output signal representative of a predetermined characteristic of the particle is generated based upon the first portion of the bipolar signal which has been passed. As shown in FIG. 14, the output signal may be generated by a combination of devices including a preamplifier 35, a fast amplifier 36, a signal discriminator 37, and a counter 38. Accordingly, the method of the present invention may include the step of discriminating the output signal. In addition, this method may be used to determine either a velocity of the particle, a charge of the particle, or an energy of the particle.

In the drawings and specification, there has been disclosed typical preferred embodiments of the invention and, although specific terms are employed, they are used in the generic and descriptive sense only and not for purposes of limitation, the scope of the invention being set forth in the following claims:

That which is claimed is:

1. An apparatus for monitoring an electrically charged particle pulse, said apparatus comprising:
   at least one coil defining an opening therethrough, said at least one coil generating a bipolar signal responsive to the electrically charged particle pulse passing through said opening, said bipolar signal comprising a first portion having a first polarity and a second portion having a second polarity;
   unipolar blocking means connected to said at least one coil for passing said first portion of said bipolar signal having said first polarity and for blocking said second portion of said bipolar signal having said second polarity; and
   monitoring means connected to said unipolar blocking means for generating an output signal representative of a predetermined characteristic of the particle pulse based upon said first portion of said bipolar signal which is passed by said unipolar blocking means.

2. An apparatus according to claim 1 further comprising charged particle pulse accelerating means for projecting the electrically charged particle pulse through said opening.

3. An apparatus according to claim 1 wherein said unipolar blocking means comprises a diode connected between said coil and said monitoring means.

4. An apparatus according to claim 3 further comprising a core and a semiconductor layer on said core, wherein said diode is formed in said semiconductor layer.

5. An apparatus according to claim 4 wherein said coil comprises a metal portion on said semiconductor layer.

6. An apparatus according to claim 1 wherein said coil has a toroidal shape.

7. An apparatus according to claim 6 wherein said toroidal coil comprises a plurality of windings electrically connected in parallel, and wherein each of said windings comprises a plurality of conductive loops.

8. An apparatus according to claim 1 wherein said at least one coil comprises a plurality of coils serially arranged so as to define a predetermined path for passage of the electrically charged particle pulse through each respective opening of each respective coil.

9. An apparatus according to claim 8 wherein said unipolar blocking means comprises a plurality of diodes, a respective diode being connected between a respective coil and said monitoring means.

10. An apparatus according to claim 1 wherein said at least one coil comprises a plurality of coils arranged so as to define a plurality of predetermined paths, a respective path being defined by a respective opening of a respective coil.

11. An apparatus according to claim 1 wherein said monitoring means comprises means for determining one of a velocity of the particle pulse, a charge of the particle pulse, and an energy of the particle pulse.

12. An apparatus according to claim 1 wherein said monitoring means comprises a preamplifier.

13. An apparatus according to claim 1 wherein said monitoring means comprises a signal discriminator.

14. An apparatus for monitoring an electrically charged particle pulse moving along a predetermined path, said apparatus comprising:
   charged particle pulse accelerating means for projecting the electrically charged particle pulse along the predetermined path;
   a plurality of toroidal coils, wherein each of said toroidal coils defines a respective opening therethrough with each of said openings positioned along the predetermined path, and wherein each of said toroidal coils generates a bipolar signal responsive to the electrically charged particle pulse passing through said respective opening, said bipolar signal comprising a first portion having a first polarity and a second portion having a second polarity;
   unipolar blocking means connected to each of said toroidal coils for passing said first portion of each of said bipolar signals having said first polarity and for blocking said second portion of each of said bipolar signals having said second polarity; and
   monitoring means connected to said unipolar blocking means for generating an output signal representative of a predetermined characteristic of the particle pulse based upon said first portions of said bipolar signals.

15. An apparatus according to claim 14 wherein said plurality of toroidal coils comprise a plurality of toroidal coils serially arranged along the predetermined path.

16. An apparatus according to claim 14 wherein said unipolar blocking means comprises a plurality of diodes, a respective diode being connected between a respective toroidal coil and the monitoring means.

17. An apparatus according to claim 16 further comprising at least one core and a semiconductor layer on said core, wherein one of said diodes is formed in said semiconductor layer.

18. An apparatus according to claim 17 wherein one of said toroidal coils comprises a metal portion on said semiconductor layer.

19. An apparatus according to claim 14 wherein each of said toroidal coils comprises a plurality of windings electrically connected in parallel, and wherein each of said windings comprises a plurality of conductive loops.

20. An apparatus according to claim 14 wherein said plurality of toroidal coils and unipolar blocking means are connected in parallel.

21. An apparatus according to claim 14 wherein said monitoring means comprises means for determining one of a velocity of the particle pulse, a charge of the particle pulse, and an energy of the particle pulse.

22. An apparatus according to claim 14 wherein said monitoring means comprises a preamplifier having a predetermined input impedance.

23. A method of monitoring an electrically charged particle pulse moving along a predetermined path, comprising the steps of:

projecting the electrically charged particle pulse through an opening in at least one toroidal coil thereby generating a bipolar signal comprising a first portion having a first polarity and a second portion having a second polarity;

passing said first portion of said bipolar signal having said first polarity, while blocking said second portion of said bipolar signal having said second polarity; and generating an output signal representative of a predetermined characteristic of the particle pulse based upon said first portion of said bipolar signal which is passed by said passing step.

24. A method according to claim 23 further comprising the step of discriminating said output signal.

25. A method according to claim 23 wherein said output signal generating step comprises the step of determining one of a velocity of the particle pulse, a charge of the particle pulse, and an energy of the particle pulse.

* * * * *